(12) United States Patent
Yamada et al.

(10) Patent No.: US 10,825,697 B2
(45) Date of Patent: Nov. 3, 2020

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Tomoyuki Yamada, Toyama (JP); Tadashi Kontani, Toyama (JP); Seiyo Nakashima, Toyama (JP); Mikio Ohno, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/795,157

(22) Filed: Feb. 19, 2020

(65) Prior Publication Data

US 2020/0303219 A1  Sep. 24, 2020

(30) Foreign Application Priority Data

Mar. 20, 2019 (JP) .................................. 2019-053470

(51) Int. Cl.
*H01L 21/67* (2006.01)
*H01L 21/324* (2006.01)

(52) U.S. Cl.
CPC ...... *H01L 21/67017* (2013.01); *H01L 21/324* (2013.01); *H01L 21/67109* (2013.01)

(58) Field of Classification Search
CPC ............. H01L 21/67017; H01L 21/324; H01L 21/67109
See application file for complete search history.

(56) References Cited

U.S. PATENT DOCUMENTS

| 9,548,229 B2 | 1/2017 | Yachi |
| 9,695,511 B2 | 7/2017 | Murata et al. |
| 2014/0094027 A1* | 4/2014 | Azumo ............. H01L 21/02252 438/591 |
| 2018/0148834 A1 | 5/2018 | Kamimura et al. |

FOREIGN PATENT DOCUMENTS

| JP | 07-190431 A | 7/1995 |
| JP | 2004-193238 A | 7/2004 |
| JP | 2007-242791 A | 9/2007 |
| JP | 2013-062271 A | 4/2013 |

* cited by examiner

*Primary Examiner* — Dzung Tran
(74) *Attorney, Agent, or Firm* — Volpe Koenig (57) ABSTRACT

There is installed a configuration that includes a process container; a heater chamber exhaust duct configured to discharge an air that has cooled a space at which a heater is installed; a gas box exhaust duct configured to suck and discharge an atmosphere in a gas box; a scavenger exhaust duct configured to suck and discharge an atmosphere in a scavenger; a local exhaust duct configured to suck and discharge an atmosphere in a local exhaust port installed in a transfer chamber; an exhaust damper valve including an opening degree variable mechanism installed in at least one selected from the group of the heater chamber exhaust duct, the gas box exhaust duct, the scavenger exhaust duct, and the local exhaust duct; and a controller configured to remotely control an opening degree of the exhaust damper valve.

10 Claims, 10 Drawing Sheets

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION(S)

This application is based upon and claims the benefit of priority from Japanese Patent Application No. 2019-053470, filed on Mar. 20, 2019, the entire contents of which are incorporated herein by reference.

TECHNICAL FIELD

The present disclosure relates to a substrate processing apparatus, a method of manufacturing a semiconductor device, and a recording medium for performing thin film generation, oxidation, diffusion, CVD, and heat treatment such as annealing or the like on a substrate such as a silicon wafer or the like.

BACKGROUND

Many chemical substances are available as chemical substances used when a substrate is heat-treated in a substrate processing apparatus. The chemical substances are classified into a flammable substance, a burnable substance, a toxic substance, a corrosive substance, and the like. Furthermore, there are substances that are harmful to the human body.

Stainless steel pipes are usually used as pipes for transporting chemical substances to a process furnace. Since a joint or the like is used for connection between pipes, chemical substances may be leaked to the outside through the joint. Conventionally, in order to prevent chemical substances from being leaked, pipes are accommodated in a gas box, and the inside of the gas box is evacuated to a negative pressure, whereby workers are prevented from being exposed to chemical substances when the chemical substances are leaked.

As an example, in a gas box of the related art, a damper valve is installed at an exhaust flow path. By moving an adjustment plate installed at the damper valve, the damper valve is manually adjusted so that the pressure inside the gas box becomes a pressure capable of preventing from being exposed to leaked chemical substances. Furthermore, a pressure sensor is also installed so that when a negative pressure is insufficient, a safety circuit is activated to stop the supply of chemical substances.

In the related art, it is necessary to periodically adjust the damper valve to maintain the pressure in order to prevent the safety circuit, which stops the supply of chemical substances, from activating due to a pressure drop. The pressure drop may be caused by the fluctuation in facility pressure due to an increase or decrease in the number of devices. When the safety circuit is activated to stop the supply of chemical substances, the substrate under processing becomes defective in production and a large loss occurs. By excessively opening the damper valve, it is possible to suppress the pressure drop in the existing pipes. However, the amount of exhaust gas increases, which leads to an increase in production cost.

Moreover, since the damper valve is provided between the gas box and the exhaust duct, it may be installed at a high place depending on the specifications. In that case, the adjustment work may be dangerous.

SUMMARY

Some embodiments of the present disclosure provide a substrate processing apparatus, a method of manufacturing a semiconductor device, and a recording medium that makes it possible to automatically and remotely control an opening degree of an exhaust damper valve.

According to one or more embodiments of the present disclosure, there is provided a configuration that includes a process container; a lid configured to close an opening of the process container; a transfer chamber configured to communicate with the opening of the process container when the lid is opened, and transfer a substrate; a heater configured to heat the substrate in the process container; a gas box configured to accommodate a device that controls a flow of a gas supplied to the process container; a scavenger installed to surround a periphery of an introducing portion whereby the gas is introduced into the process container, a heater chamber exhaust duct configured to discharge an air that has cooled a space at which the heater is installed; a gas box exhaust duct configured to suck and discharge an atmosphere in the gas box; a scavenger exhaust duct configured to suck and discharge an atmosphere in the scavenger: a local exhaust duct configured to communicate with a local exhaust port installed at a predetermined location in the transfer chamber, and suck and discharge an atmosphere in the local exhaust port; an exhaust damper valve including an opening degree variable mechanism installed in at least one selected from the group of the heater chamber exhaust duct, the gas box exhaust duct, the scavenger exhaust duct, and the local exhaust duct, which are connected to a factory exhaust duct kept at a negative pressure; and a controller installed at a height operable from an installation surface, and configured to remotely control an opening degree of the exhaust damper valve in response to an operation.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
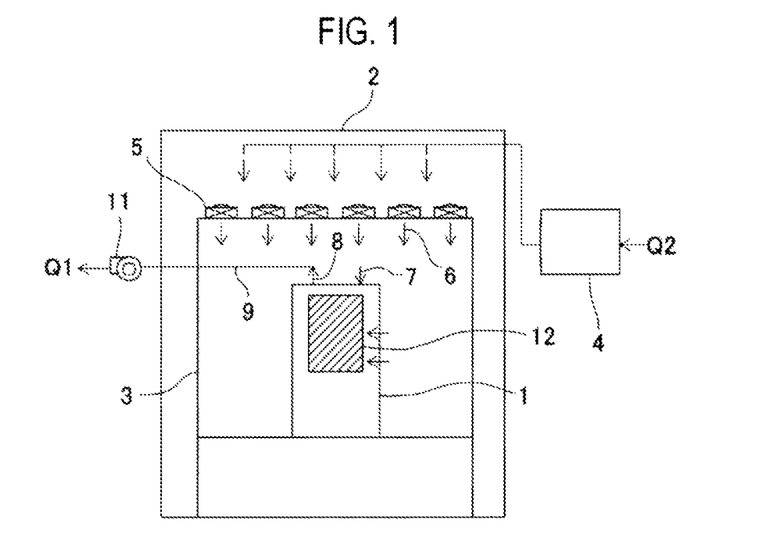
FIG. 1 is a schematic diagram showing a clean room and a substrate processing apparatus installed in the clean room according to embodiments of the present disclosure.
Figure 2:
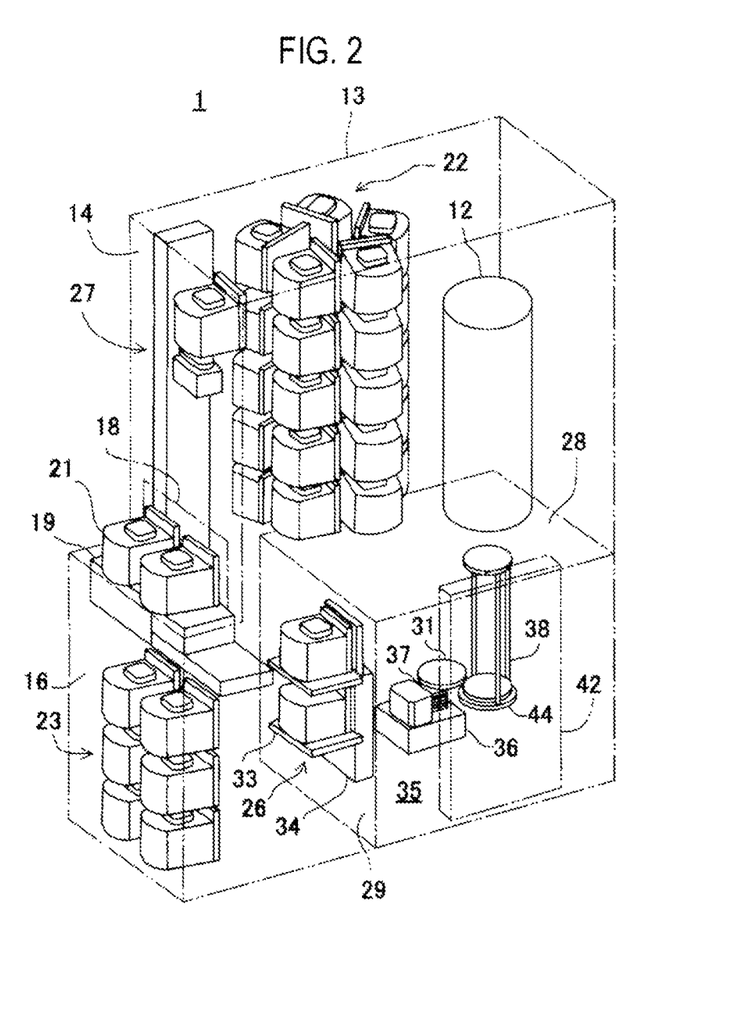
FIG. 2 is a perspective view showing the substrate processing apparatus according to the embodiments.
Figure 3:
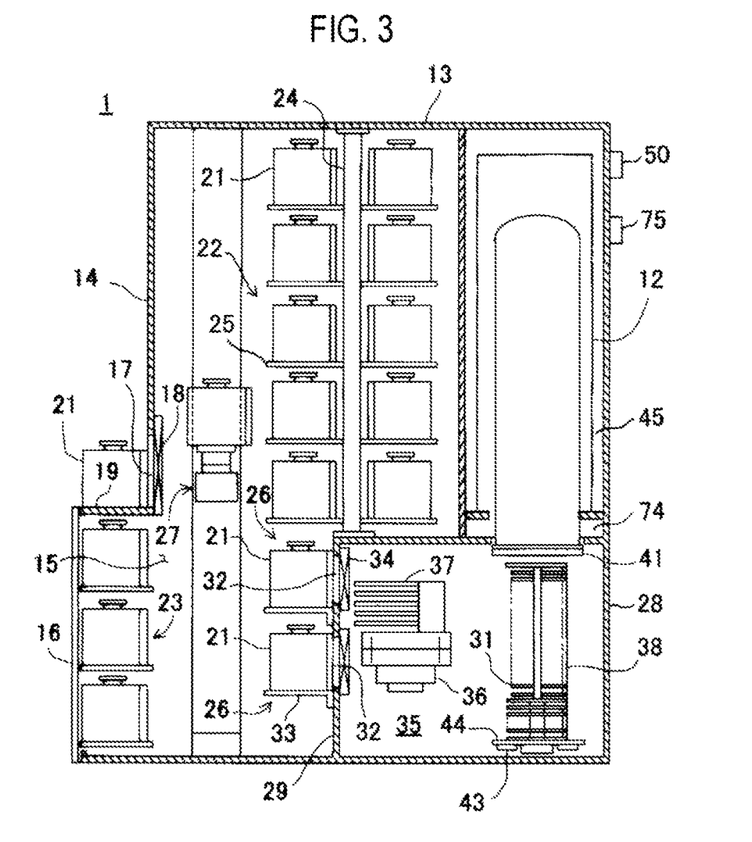
FIG. 3 is a side view showing the substrate processing apparatus according to the embodiments.

Hereinafter, embodiments of the present disclosure will be described with reference to the drawings. FIG. 1 shows a clean room in which a substrate processing apparatus is installed. FIGS. 2 and 3 show a vertical substrate processing apparatus as an example of the substrate processing apparatus. The substrate processed in the substrate processing apparatus may be, for example, a wafer made of silicon or the like.

As shown in FIG. 1, the substrate processing apparatus 1 is installed in a clean room 3 of a semiconductor factory 2. After the temperature and humidity of an external air introduced from the outside of the semiconductor factory 2 are controlled by an external air conditioner 4, the air 6 from which dust have been removed by a FFU (Fan Filter Unit) 5 is introduced into the clean room 3.

An intake duct (intake port) 7 and an exhaust duct 8 are provided at the upper surface of the substrate processing apparatus 1. The exhaust duct 8 is connected to a factory exhaust duct (facility exhaust duct) 9 extending outside the factory. An exhaust fan 11 is provided at the factory exhaust duct 9, and the inside of the factory exhaust duct 9 is always maintained at a predetermined negative pressure by the exhaust fan 11 in order to prevent backflow.

The air 6 introduced into the substrate processing apparatus 1 through the intake duct 7 is used for purging a clean atmosphere filling a transfer chamber (described below), a cooling medium of a process furnace (heater) 12, a harmful gas and particles, and then discharged to the outside of a factory by the exhaust fan 11 through the exhaust duct 8 and the factory exhaust duct 9. The intake duct 7 and the exhaust duct 8 may be provided individually for each application.

In addition, the factory exhaust duct can be divided into a plurality of systems depending on the necessity of exhaust gas decontamination, the temperature, and the like.

As shown in FIGS. 2 and 3, the substrate processing apparatus 1 includes a housing 13. A front maintenance port 15 serving as an opening is provided at a lower portion of a front wall 14 of the housing 13 to allow maintenance. The front maintenance port 15 is opened and closed by a front maintenance door 16.

A pod-loading/unloading port 17 is opened at the front wall 14 of the housing 13 to communicate with the inside and outside of the housing 13. The pod-loading/unloading port 17 is opened and closed by a front shutter 18. A load port 19 is installed at the front side of the pod-loading/unloading port 17. The load port 19 is configured to align the pod 21 mounted thereon.

The pod 21 is a hermetically sealed substrate container, and is configured so that it can be loaded onto the load port 19 and unloaded from the load port 19 by an in-process transfer device (not shown).

A rotary pod shelf 22 is installed at an upper portion inside the housing 13 at a substantially central portion in the front-rear direction. The rotary pod shelf 22 is configured to store a plurality of pods 21. A spare pod shelf 23 is installed in the front maintenance port 15 and below the load port 19. The spare pod shelf 23 is configured to store a plurality of pods 21.

The rotary pod shelf 22 includes a support column 24 vertically installed to intermittently rotate, and a plurality of shelf plates 25 radially supported by the support column 24 at the respective positions of upper, middle and lower stages. The shelf plates 25 are configured to store a plurality of pods 21 mounted thereon.

A pod opener 26 is provided below the rotary pod shelf 22. The pod opener 26 is configured to mount the pod 21 thereon and to open and close the lid of the pod 21.

A pod transfer device 27 is installed between the load port 19, the rotary pod shelf 22, and the pod opener 26. The pod transfer device 27 is configured to hold the pod 21 and can move up and down, forward and backward, and in a traverse direction. The pod transfer device 27 is configured to transfer the pod 21 between the load port 19, the rotary pod shelf 22, and the pod opener 26.

A sub-housing 28 is provided at the lower portion inside the housing 13 near the rear side in the front-rear direction over the rear end. A pair of wafer-loading/unloading ports 32 for loading and unloading a wafer (substrate) 31 into and from the sub-housing 28 is provided at the front wall 29 of the sub-housing 28 and is vertically arranged in two stages. A pod opener 26 is provided for each of the upper and lower wafer-loading/unloading ports 32.

The pod opener 26 includes a mounting table 33 for mounting the pod 21 and an opening/closing mechanism 34 for opening and closing the lid of the pod 21. The pod opener 26 is configured to open and close the wafer entrance of the pod 21 by opening and closing the lid of the pod 21 mounted on the mounting table 33 using the opening/closing mechanism 34.

The sub-housing 28 forms a transfer chamber (loading area) 35 airtightly separated from a space (pod transfer space) in which the pod transfer device 27 and the rotary pod shelf 22 are arranged. A wafer transfer mechanism (hereinafter also referred to as a transfer machine) 36 is provided at the front area of a transfer chamber 35. The transfer machine 36 has a required number of (five, in the drawings) wafer-mounting plates (substrate support portions) 37 for holding wafers 31. The wafer-mounting plates 37 are capable of moving linearly in the horizontal direction, rotating in the horizontal direction, and moving in the vertical direction. The transfer machine 36 is configured to load and unload the wafers 31 into and from a boat (substrate holder) 38.

A heater chamber 45 (see FIGS. 3 and 9) is provided above the transfer chamber 35 with a scavenger 74 interposed therebetween. A vertical process furnace 12 is installed in the heater chamber 45. The process furnace 12 has a process chamber formed therein. A furnace port existing on the lower side of the process chamber is located in the scavenger 74. The lower end of the furnace port is opened and is opened and closed by a furnace port shutter 41. An inlet for introducing a gas into the process chamber and an exhaust pipe for exhausting an atmosphere in the process chamber may be provided at the side surface of the furnace port. The furnace port to which many pipes are connected is constituted by a short flange pipe usually called a manifold. The scavenger 74 may be installed as a box or a wall surrounding such a furnace port configuration.

A boat elevator 42 for raising and lowering the boat 38 is installed at the side surface of the sub-housing 28. A seal cap 44 as a cover is horizontally attached to an arm 43 connected to the elevating table of the boat elevator 42. The seal cap 44 may support the boat 38 vertically and may airtightly close the furnace port in a state in which the boat 38 is loaded into the process furnace 12. The boat 38 is configured to hold a plurality of (e.g., about 50 to 175) wafers 31 in a horizontal posture and in multiple stages with the centers of the wafers 31 aligned with one another.

A clean unit (not shown) is installed at a position facing the boat elevator 42. The clean unit includes a supply fan and a dustproof filter to supply a clean atmosphere or a clean air as an inert gas. A notch-aligning device (not shown) as a substrate-aligning device for aligning the position of the wafer 31 in the circumferential direction is installed between the transfer machine 36 and the clean unit.

The clean air blown out from the clean unit flows through the notch-aligning device, the transfer machine 36, and the boat 38. Then, a part of the clean air is sucked into a local exhaust duct 59 (or a common exhaust duct) or the like and exhausted to the outside of the housing 13 through the exhaust duct 8. Another part of the clean air is blown into the transfer chamber 35 again by the clean unit.

Next, the operation of the substrate processing apparatus 1 will be described.

When the pod 21 is supplied to the load port 19, the pod-loading/unloading port 17 is opened by the front shutter 18. The pod 21 on the load port 19 is loaded into the housing 13 through the pod-loading/unloading port 17 by the pod transfer device 27 and is mounted on the designated shelf plate 25 of the rotary pod shelf 22. After the pod 21 is temporarily stored on the rotary pod shelf 22, the pod 21 may be transferred from the shelf plate 25 to one of the pod openers 26 by the pod transfer device 27 and mounted on the mounting table 33, or may be directly transferred from the load port 19 to the mounting table 33.

The opening side end surface of the pod 21 mounted on the mounting table 33 is pressed against the opening edge portion of the wafer-loading/unloading port 32 of the front wall 29 of the sub-housing 28. The lid of the pod 21 is removed by the opening/closing mechanism 34, and the wafer entrance is opened.

When the pod 21 is opened by the pod opener 26, the transfer machine 36 takes out the wafer 31 from the pod 21 and loads (charges) the wafer 31 into the boat 38. The transfer machine 36 that has delivered the wafer 31 to the boat 38 returns to the pod 21 and loads the next wafer 31 into the boat 38.

When a predetermined number of wafers 31 are loaded in the boat 38, the furnace port of the process furnace 12 closed by the furnace port shutter 41 is opened by the furnace port shutter 41. Subsequently, the boat 38 is raised by the boat elevator 42 and is loaded into the process furnace 12.

After the loading in the boat 38, arbitrary processing is performed on the wafers 31 in the process furnace 12. After the processing, the wafers 31 and the pod 21 are carried out of the housing 13 by a procedure opposite to the above-described procedure.

Figure 4:
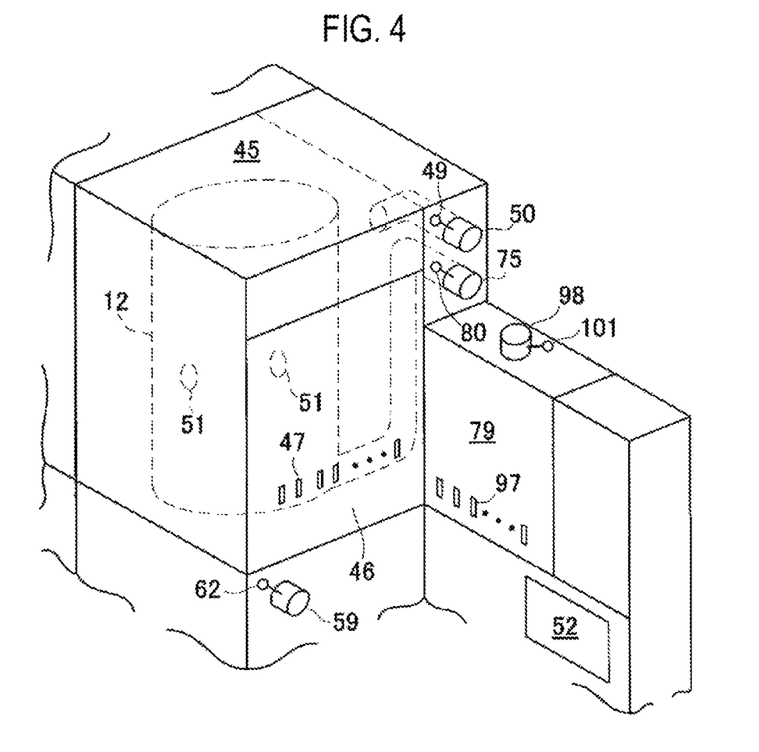
FIG. 4 is a perspective view showing a heater chamber, a gas box, and the like of the substrate processing apparatus according to the embodiments.
Figure 8:
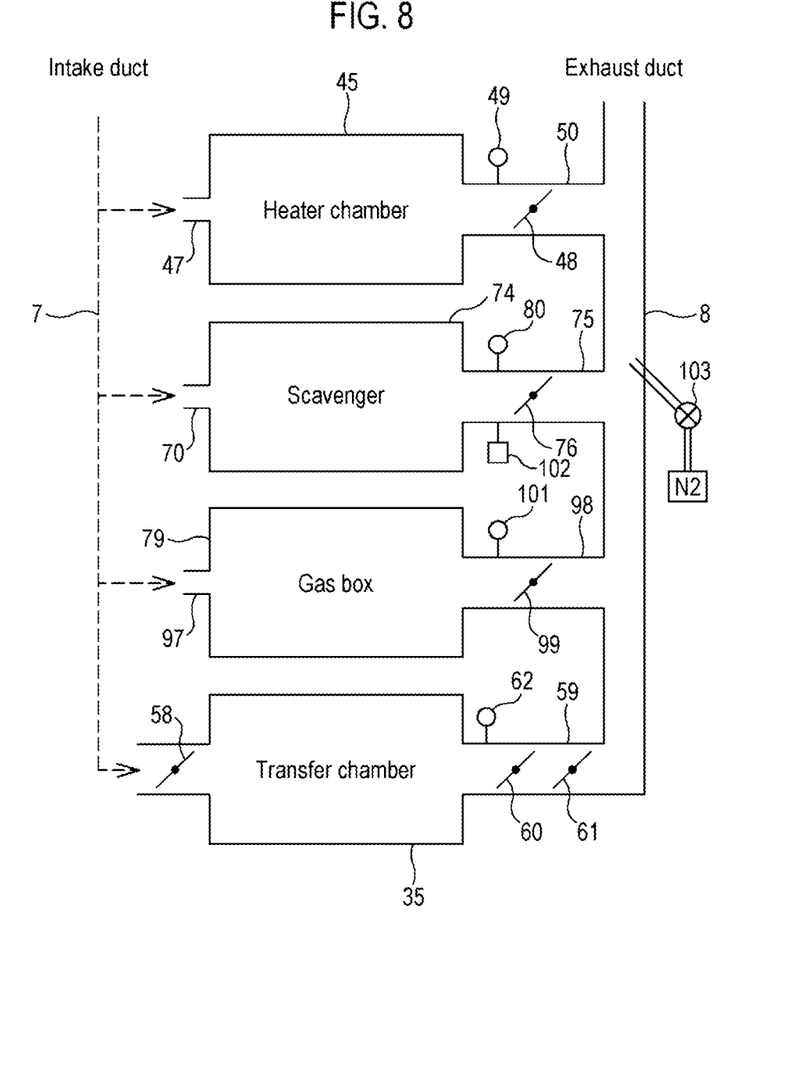
FIG. 8 is an explanatory view for explaining an air intake/exhaust system according to the embodiments.

Next, the air intake/exhaust system will be described with reference to FIGS. 4 and 8. As shown in FIG. 8, the substrate processing apparatus 1 includes the heater chamber 45, the scavenger 74, a gas box 79, and the transfer chamber 35 as air flow paths for introducing and exhausting (consuming) the air in the clean room. In this figure, a system for filtering or cooling and circulating an air is omitted. As shown in FIG. 4, the heater chamber 45 that accommodates the process furnace 12 is provided at the back side of the substrate processing apparatus 1. The rear door 46 for opening and closing the heater chamber 45 is provided with a heater chamber inlet 47 for taking an air into the heater chamber 45. The heater chamber 45 is provided at the left side when viewed from the back side of the substrate processing apparatus 1. A space for accommodating a scavenger exhaust duct 75 described below, cables (not shown), electrical components, and the like is defined at the right side.

A heater chamber exhaust duct 50 for exhausting the air heated in the heater chamber 45 and a scavenger exhaust duct 75 for exhausting the air present in the scavenger 74 are provided at the upper side of the rear surface of the housing 13 of the substrate processing apparatus 1. The heater chamber exhaust duct 50 includes a pressure sensor 49 provided at upstream side of a heater chamber exhaust damper valve 48 with an opening degree variable mechanism. The scavenger exhaust duct 75 includes a pressure sensor 80 provided at upstream side of a scavenger exhaust damper valve 76. The detection results of the pressure sensors 49 and 80 are fed back to a process module controller 96 or a main control part 95 described below. In FIG. 4, the heater chamber exhaust duct 50 is shown as being cut at a location downstream of the pressure sensor 49 and upstream of the heater chamber exhaust damper valve 48. Other ducts are also shown in the same manner.

Temperature sensors 51 are attached to an exterior plate (heat shield plate) and a rear door 46 of the process furnace 12 so as to prevent burns which may be caused by the high temperature of the portion touched by a person. For example, when the surface temperature of the process furnace 12 is higher than a predetermined temperature, the rear door 46 may be locked so as not to be opened.

The gas box 79 is one of utilities provided at the rear surface of the housing 13 of the substrate processing apparatus 1 to extend rearward. In this example, the gas box 79 is adjacent to the rear surface of the housing 13 and is provided at the position having substantially the same height as the heater chamber 45. The gas box 79 is a rectangular parallelepiped box that accommodates a MFC (mass flow controller) 77, a valve 78, and a gas supply pipe 73 connecting them. A plurality of gas box intake ports 97 slit-shaped for introducing an external air is formed on the front surface of the gas box 79. A gas box exhaust duct 98 as an exhaust port for exhausting the atmosphere in the gas box 79 is connected to the upper surface of the gas box 79. The gas box exhaust duct 98 is connected to the factory exhaust duct 9. The gas box exhaust duct 98 is provided with a gas box exhaust damper valve 99 having an opening degree variable mechanism, and a pressure sensor 101 located upstream of the gas box exhaust damper valve 99.

In the gas box 79 and the scavenger 74, a gas may be leaked from pipes. In particular, when a highly explosive or highly toxic gas is leaked, it is required to dilute the gas to a level allowed in a factory exhaust system. A gas concentration meter 102 is provided at the exhaust duct 8 or the scavenger exhaust duct 75 downstream of the exhaust of the scavenger 74, and monitors the concentration of a specific gas type. An emergency dilution valve 103 discharges the nitrogen gas for dilution to the exhaust duct 8 or the scavenger exhaust duct 75 at a large flow rate when the gas concentration meter 102 detects a gas having a concentration higher than a specified value.

The transfer chamber 35 is provided with a sealable intake damper 58 that introduces an air existing in the clean room. The introduced air merges with the local exhaust gas in the transfer chamber 35 and is sent to a filter by a blower. Furthermore, the air becomes a purified positive-pressure air and circulates inside the transfer chamber 35. An excess air is discharged to the factory exhaust duct 9 through the transfer chamber exhaust duct 59 provided at a plane of the transfer chamber 35. The transfer chamber exhaust duct 59 is provided with an automatic damper 60 which is opened when the pressure difference becomes equal to or larger than a predetermined value, a transfer chamber exhaust damper valve 61 that can fully close and fully open the transfer chamber exhaust duct 59, and a pressure sensor 62 located upstream of the automatic damper 60.

At a predetermined position of the substrate processing apparatus 1, there is provided an operation panel (operation part) 52 of a main control part 95 (described below) for performing various controls on the substrate processing apparatus 1. The operation part 52 is, for example, a touch panel, and includes an input part for inputting a control value to the main control part 95 and a display part for displaying the inputted control value in a recognizable manner. The installation position of the operation part 52 is the side or back surface of the utility existing at the rear of the housing 13 or the front surface of the substrate processing apparatus 1, and has a height at which the operation part 52 can be operated by an operator standing on the installation surface (or the floor box) of the substrate processing apparatus 1. The operator may directly control the opening degree of the gas box exhaust damper valve 99 and the like by directly inputting a control value to the operation part 52 via the input part and designating the opening degree.

Figure 5:
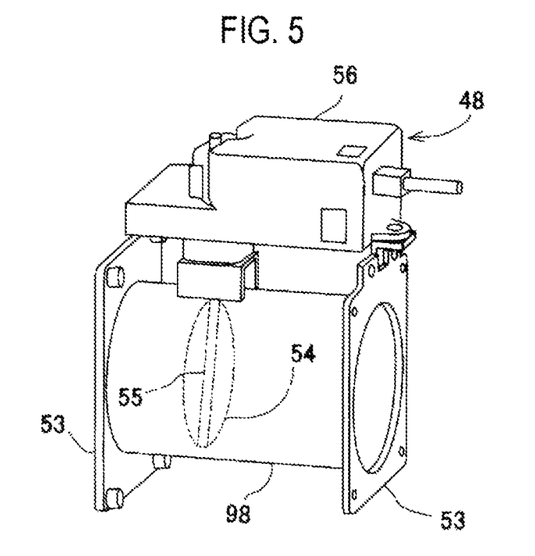
FIG. 5 is a perspective view showing a gas box exhaust damper valve according to the embodiments.
Figure 6:
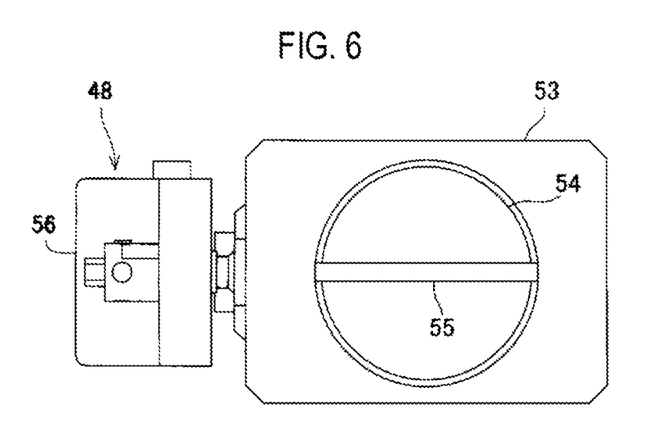
FIG. 6 is a front view showing the gas box exhaust damper valve according to the embodiments.
Figure 7:
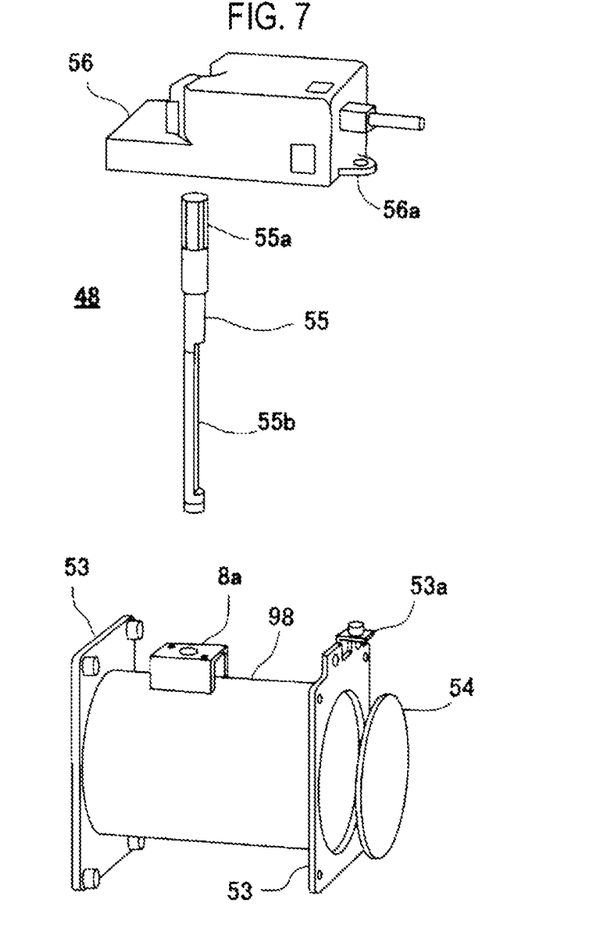
FIG. 7 is an exploded perspective view showing the gas box exhaust damper valve according to the embodiments.

Next, the details of the gas box exhaust damper valve 99 according to the present embodiments will be described with reference to FIGS. 5 to 7. The structures of the heater chamber exhaust damper valve 48 and the scavenger exhaust damper valve 76 are the same as the structure of the gas box exhaust damper valve 99. Therefore, the description thereof will be omitted.

Flanges 53 are respectively formed at both ends of the gas box exhaust duct 98. The gas box exhaust duct 98 is connected to the gas box 79 via one flange 53, and the gas box exhaust duct 98 is connected to the factory exhaust duct 9 via the other flange 53. On one side of one of the flanges 53, there is provided an attaching flange 53a for attaching a below-described motor 56 to the gas box exhaust duct 98. Furthermore, a pedestal portion 8a for holding a shaft 55 and a motor 56, which will be described below, is provided on the peripheral surface of the gas box exhaust duct 98.

The gas box exhaust duct 98 is provided with a gas box exhaust damper valve 99. The gas box exhaust damper valve 99 includes a disk-shaped shutter (valve body) 54 having a diameter slightly smaller than the inner diameter of the gas box exhaust duct 98, a shaft 55 provided so as to be integrally rotatable over the entire radial length of the shutter 54 and having both ends rotatably held by the gas box exhaust duct 98, and a motor 56 for rotationally driving the shaft 55.

At one end of the shaft 55, there is formed a fitting portion 55a that fits with the output shaft of the motor 56 by a D-cut (planar chamfering), a boss, or the like, and a driving force of the motor 56 is transmitted to the shaft 55 via the fitting portion 55a. A flat portion 55b that can be joined to the shutter 54 is formed at the lower portion of the shaft 55. Furthermore, the motor 56 is provided with an attaching flange 56a for attaching the motor 56 to the gas box exhaust duct 98.

The gas box exhaust damper valve 99 is attached to the gas box exhaust duct 98 by inserting the shaft 55 into the gas box exhaust duct 98 through the pedestal portion 8a in a state in which the fitting portion 55a is coupled to the output shaft of the motor 56, then fixing the shutter 54 to the flat portion 55b with a screw, and screwing the attaching flanges 53a and 56a.

The motor 56 is, for example, a geared servomotor, and is capable of rotating the shaft 55 at a corresponding angle based on the opening degree command value inputted from the operation part 52 and adjusting the opening degree of the shutter 54 in a stepless manner.

Figure 9:
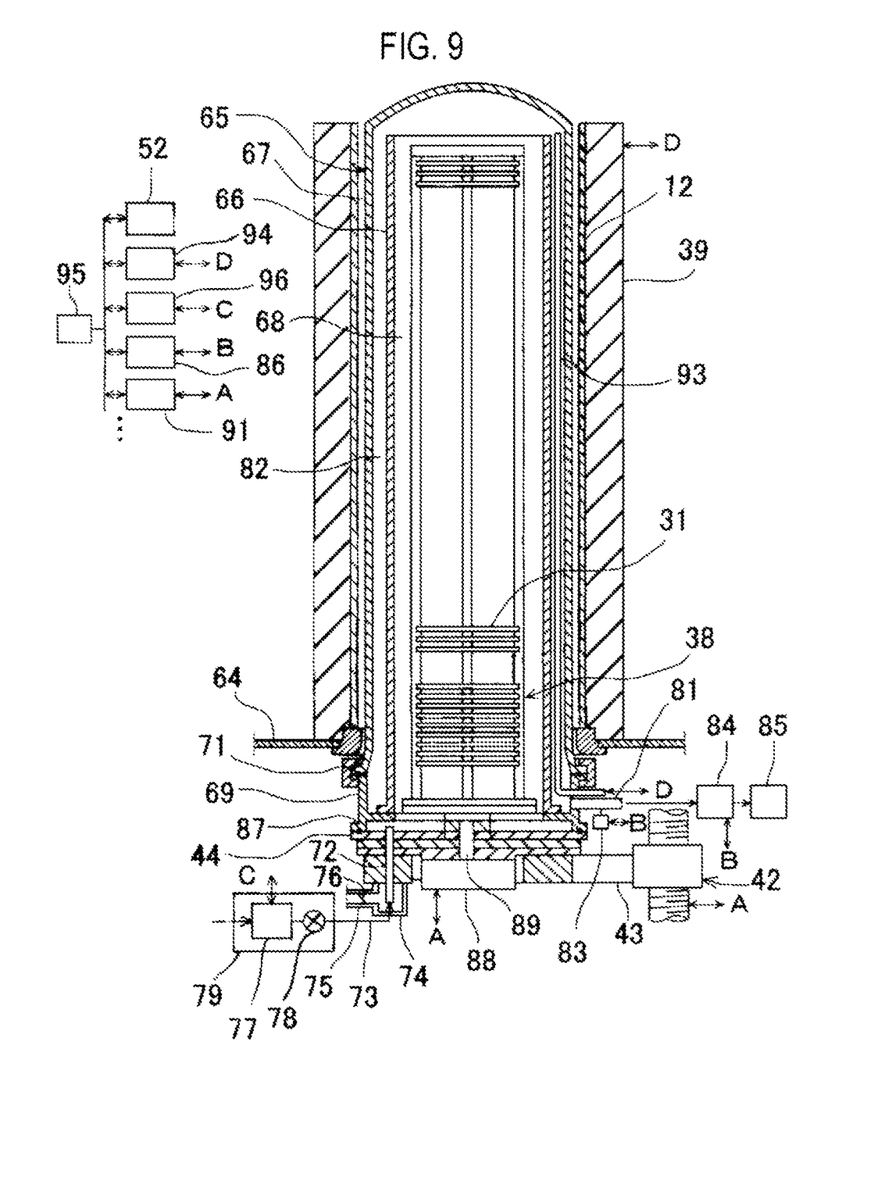
FIG. 9 is a vertical sectional view showing a process furnace according to the embodiments.

FIG. 9 is a vertical sectional view showing a periphery of the process furnace 12 of the substrate processing apparatus 1 suitably used in the embodiments of the present disclosure. The process furnace 12 has a cylindrical shape, and is vertically installed by being supported on a heater base 64 as a holding plate. A heater 39 as a heating mechanism is provided at the inner peripheral surface of the process furnace 12.

Inside the process furnace 12, a process tube 65 is disposed concentrically with the process furnace 12. The process tube 65 includes an inner tube 66 made of, for example, a heat-resistant material such as quartz ($SiO_2$), silicon carbide (SiC), or the like, and an outer tube 67. The inner tube 66 is formed in a cylindrical shape with the upper and lower ends thereof opened, and constitutes most of the process container. A process chamber 68 is formed at the hollow portion of the inner tube 66, and is configured to accommodate the wafers 31 in a state in which the wafers 31 are arranged in a horizontal posture by the boat 38 in multiple stages along the vertical direction. The outer tube 67 has an inner diameter larger than the outer diameter of the inner tube 66. The outer tube 67 is formed in a cylindrical shape with the upper end thereof closed and the lower end thereof opened. The outer tube 67 is provided concentrically with the inner tube 66.

Below the outer tube 67, a manifold 69 is disposed concentrically with the outer tube 67. The manifold 69 is made of, for example, a nickel alloy or the like, and is formed in a cylindrical shape with the upper and lower ends thereof opened. The manifold 69 is engaged with the inner tube 66 and the outer tube 67 and is provided to support the inner tube 66 and the outer tube 67. An O-ring 71 as a seal member is provided between the manifold 69 and the outer tube 67. By being supported on the manifold 69, the process tube 65 comes into a vertically installed state. A process container is formed by the process tube 65 and the manifold 69.

A nozzle 72 as a gas introduction part is connected to the seal cap 44 or the manifold 69 so as to communicate with the inside of the process chamber 68. A gas supply pipe 73 is connected to the nozzle 72. In addition, the scavenger 74 is provided below the heater base 64 so as to surround a connection portion between the nozzle 72 (or the process container) and the gas supply pipe 73. In the example of FIG. 9, the connection portion of the gas supply pipe 73 is located below the seal cap 44. Therefore, the scavenger 74 is fixed to the seal cap 44 so as to move up and down together with the seal cap 44.

The scavenger 74 is provided with a scavenger exhaust duct 75 for sucking and discharging the atmosphere in the scavenger 74, and the scavenger exhaust duct 75 is connected to a scavenger exhaust damper valve 76. The space surrounded by the scavenger 74 communicates with the outside of the scavenger 74 through a gap 70 formed between the space and the gas supply pipe 73 or other members. The air in the substrate processing apparatus 1 is sucked from the space. Alternatively, an intake duct for supplying an inert gas or the like into the scavenger 74 may be separately provided.

The scavenger exhaust duct 75 is connected to the factory exhaust duct 9. The atmosphere in the scavenger 74 is discharged to the outside of the factory together with the air 6 discharged from the heater chamber exhaust duct 50. By exhausting the atmosphere in the scavenger 74, even if a gas is leaked from the space between the gas supply pipe 73 and the nozzle 72 to the scavenger 74, it is possible to prevent the gas from diffusing into the substrate processing apparatus 1. The structure of the scavenger exhaust damper valve 76 is the same as the structure of the gas box exhaust damper valve 99. Therefore, the description thereof will be omitted.

A chemical substance supply source (not shown) or an inert gas supply source (not shown) is connected to the upstream side opposite to the connection side of the gas supply pipe 73 with the nozzle 72 via a MFC (mass flow controller) 77 as a gas flow controller or a valve 78. The MFC 77 and the like are electrically connected to the process module controller 96. The MFC 77 and the valve 78 are accommodated in the gas box 79.

An exhaust pipe 81 for exhausting the atmosphere in the process chamber 68 is configured to communicate with the manifold 69. The exhaust pipe 81 is arranged at a lower end of a cylindrical space 82 formed in a gap between the inner tube 66 and the outer tube 67 and is configured to communicate with the cylindrical space 82. A vacuum exhaust device 85 such as a vacuum pump or the like is connected to the exhaust pipe 81 via a pressure sensor 83 as a pressure detector and a pressure adjustment device 84 toward the downstream side so that the pressure inside the process chamber 68 becomes a predetermined pressure (degree of vacuum). A pressure control part (pressure controller) 86 is electrically connected to the pressure sensor 83 and the pressure adjustment device 84. The pressure control part 86 is configured to control the pressure adjustment device 84 at a desired timing based on the pressure detected by the pressure sensor 83, so that the pressure inside the process chamber 68 is kept at a desired pressure (degree of vacuum) by the pressure adjustment device 84.

The seal cap 44 is horizontally supported by a boat elevator 42 as an elevating mechanism vertically installed in the sub-housing 28 via an arm 43, and is configured to be vertically moved up and down by the boat elevator 42. Thus, the boat 38 can be loaded into and unloaded from the process chamber 68. The raised seal cap 44 is brought into contact with the lower end of the manifold 69 via an O-ring 87 as a seal member.

A rotation mechanism 88 for rotating the boat 38 is provided at the opposite side of the seal cap 44 from the process chamber 68. The rotation shaft 89 of the rotation mechanism 88 is connected to the boat 38 through the seal cap 44, and is configured to rotate the wafers 31 by rotating the boat 38. A drive control part (drive controller) 91 is electrically connected to the rotation mechanism 88 and the boat elevator 42, and is configured to control the rotation mechanism 88 and the boat elevator 42 at a desired timing so as to perform a desired operation.

A temperature sensor 93 as a temperature detector is provided in the process tube 65. A temperature adjuster 94 is electrically connected to the heater 39 and the temperature sensor 93. The temperature adjuster 94 adjusts the state of supplying electric power to the heater 39 based on the temperature information detected by the temperature sensor 93, whereby the temperature in the process chamber 68 is controlled.

The main control part 95 communicates with a higher-level device connected by a network using the SEMI (Semiconductor Equipment and Materials International) standard E5 "Semiconductor Manufacturing Equipment Communication Standard 2 Message Content (SECS-II)," and manages a job for executing a series of recipes from the loading to the unloading of the wafers 31. Furthermore, the equipment status information is transmitted to the higher-level device (monitoring device) using the Interface A (E120, E125, E132, and E134) of the same standard. The main control part 95 is communicably connected to the operation part 52, the process module controller 96, the pressure control part 86, the drive control part 91, and the temperature adjuster 94 in order to control the entire substrate processing apparatus 1. The main control part 95 appropriately controls the entire substrate processing apparatus 1 via them. The main control part 95 and the process module controller 96 under the control of the main control part 95 are also collectively referred to as a controller. The controller such as the main control part 95, the process module controller 96, or the like is configured as computer that includes a CPU (Central Processing Unit), a RAM (Random Access Memory) configured as a memory area (work area) in which a program read by the CPU, data, and the like are temporarily stored, and a memory device configured to readably store a control program for controlling the operation of the substrate processing apparatus, process recipes in which pressure control procedures and conditions described below are written, and the like. The process recipes are combined to allow the controller to execute each process (each step) of a semiconductor device manufacturing method and obtain a predetermined result. The process recipes function as a program.

The process module controller 96 operates the MFC 77 and the valve 78 to control the flow rate of the supplied gas at the timing according to the recipe. Furthermore, the process module controller 96 is electrically connected to the pressure sensor 49, the heater chamber exhaust damper valve 48, and the temperature sensor 51 to feedback-control the heater chamber exhaust damper valve 48 so that the detected pressure of the pressure sensor 49 becomes a preferable negative pressure. Furthermore, the process module controller 96 is electrically connected to the pressure sensor 80 and the scavenger exhaust damper valve 76 to feedback-control the scavenger exhaust damper valve 76 so that the detected pressure of the pressure sensor 80 becomes a preferable negative pressure. Moreover, the process module controller 96 is electrically connected to the pressure sensor 101 and the gas box exhaust damper valve 99 to feedback-control the gas box exhaust damper valve 99 so that the detected pressure of the pressure sensor 101 becomes a preferable negative pressure. In addition, the process module controller 96 is electrically connected to the intake damper 58, the blower of the transfer chamber 35, the pressure sensor 62, and the transfer chamber exhaust damper valve 61 to feedback-control the blower so that the detected pressure of the pressure sensor 62 becomes an appropriate positive pressure.

The process module controller 96 or the main control part 95 may control the exhaust flow rate to a necessary minimum exhaust flow rate depending on, for example, the registration and progress of a recipe-executing job, or may control the temperature of the temperature sensor 51 to maintain at a predetermined temperature or lower by the fed-forward control for inputting a heater temperature, by using the temperature in the substrate processing apparatus 1 detected by the temperature sensor 51 or the recipe information such as the heater temperature written in the recipe or the like. Therefore, in the standby state in which the heater temperature returns to the normal temperature, the opening degree of the heater chamber exhaust damper valve 48 may be minimized to minimize the exhaust flow rate. Furthermore, when the temperature sensor 51 has detected that the temperature of the rear door 46 or the like is abnormally high, an alert may be issued at a predetermined level.

The main control part 95 is configured to receive the detected pressures of the pressure sensors 101, 49, 80, and 62 from the process module controller 96, cause the operation part 52 to display the detected pressures in response to an operation of the operation part 52, and accept from the operation part 52 an input for directly designating the opening degree of the gas box exhaust damper valve 99 or the like. The main control part 95 that has accepted the direct designation sets the value to the gas box exhaust damper valve 99 or the like via the process module controller 96. For example, by performing such manual setting during standby, it is possible to minimize the amount of exhaust from the heater chamber 45, the scavenger 74, the gas box 79, and the transfer chamber 35. The direct setting may be given not only from the operation part 52 but also from a higher-level device.

Instead of the pressure sensor 49, a flow rate sensor may be provided at the heater chamber exhaust duct 50 so that the flow rate of the air 6 flowing through the heater chamber exhaust damper valve 48 can be directly detected. Based on the flow rate of the air 6 detected by the flow rate sensor, feedback-control may be performed such that the flow rate of the air 6 in the heater chamber exhaust duct 50 is kept constant.

Figure 10:
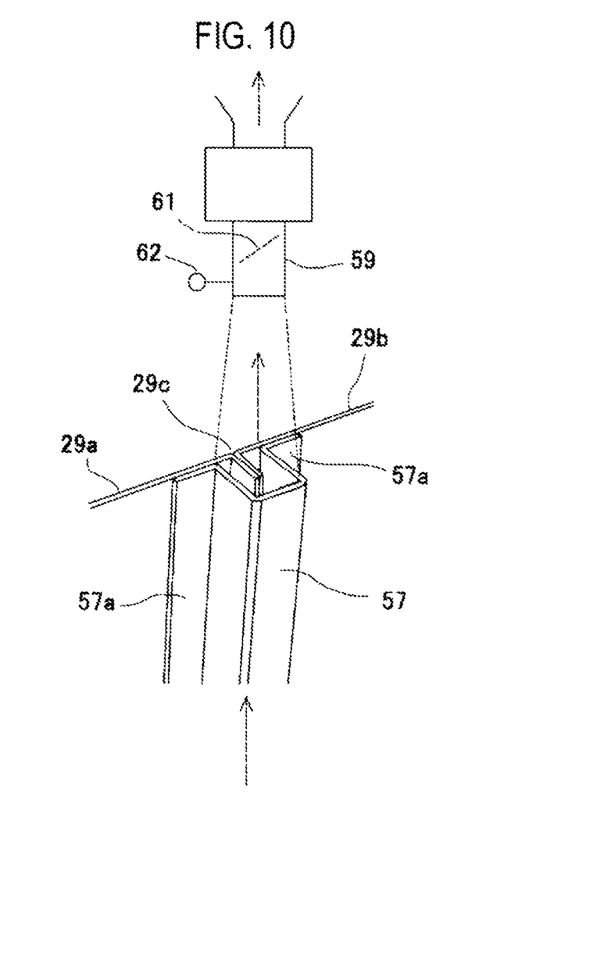
FIG. 10 is an explanatory view for explaining an isolation space in a transfer chamber according to the embodiments.

A modification of the exhaust structure of the transfer chamber 35 will be described with reference to FIG. 10. In this modification, a gas is also exhausted from a local exhaust duct provided at the transfer chamber 35. The transfer chamber 35 is a place where the high-temperature wafer 31 after being processed in the process chamber is unloaded. In order to prevent formation of a natural oxide film on the wafer 31, the transfer chamber 35 is filled with an inert gas, for example, a nitrogen ($N_2$) gas. In order to prevent intrusion of an air and particles from a periphery, the sub-housing 28 that defines the transfer chamber 35 is constructed in a box-shaped airtight structure kept at a positive pressure which is about 50 Pa higher than the atmospheric pressure.

If a leak (intrusion or release of an air) occurs in the sub-housing 28, it takes a long time to introduce a nitrogen gas and reduce an oxygen concentration to a predetermined value or lower. In the example of FIG. 10, the joint portion 29c between the wall body 29a and the wall body 29b of the sub-housing 28 is covered with a hat rib 57 having a hat-shaped cross section. A flange portion 57a of the hat rib 57 is joined to the wall body 29a and the wall body 29b by, for example, welding. The air that has entered from the joint portion 29c is not diffused into the sub-housing 28 by locally exhausting the hat rib 57.

A transfer chamber exhaust duct (local exhaust duct) 59 communicates with an isolated space as a local exhaust port formed by the hat rib 57, the wall body 29a, and the wall body 29b. The atmosphere in the isolated space is sucked and discharged to the factory exhaust duct 9. An aperture opened to the transfer chamber 35 may be provided near the tip of the hat rib 57 to generate a flow in the isolated space.

As described above, by isolating the joint portion 29c between the wall bodies 29a and 29b with the hat rib 57 and adopting the structure in which the atmosphere in the isolated space is exhausted to the outside of the substrate processing apparatus 1, it is possible to prevent oxygen from diffusing from the joint portion 29c of the sub-housing 28 into the transfer chamber 35 and to shorten the time required for the transfer chamber 35 to reach a desired oxygen concentration. In a standby state in which it is not necessary to keep the transfer chamber 35 at a low oxygen concentration, the intake damper 58 or the transfer chamber exhaust damper valve 61 may be fully closed or kept at a minimum opening degree.

Figure 11:
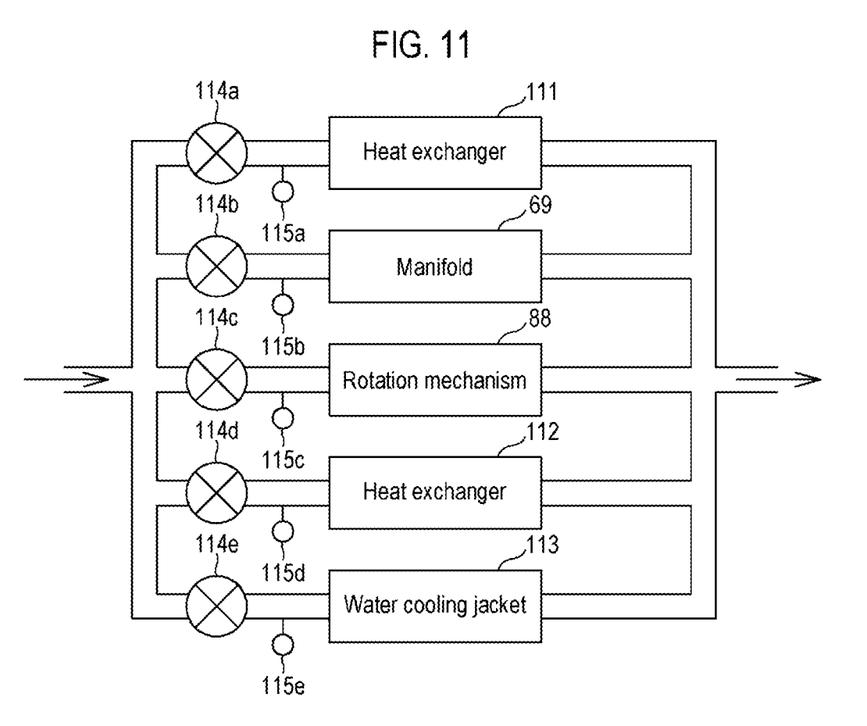
FIG. 11 is an explanatory view for explaining a cooling water system according to the embodiments.

FIG. 1 is a schematic configuration diagram of a water-cooling system of the substrate processing apparatus 1 suitably used in the embodiments of the present disclosure. The water-cooling system distributes tap water or circulating cooling water, which is supplied as cooling water to the substrate processing apparatus 1, to the respective parts required to be cooled.

A heat exchanger 11 is configured to cool the air flowing through the process furnace 12 when the process furnace 12 is to be rapidly cooled. The manifold 69 has an embedded flow path a cooling water disposed near the O-ring 71 and the like in order to cool the O-ring 71 and the like. The rotation mechanism 88 requires cooling water to protect a heat-sensitive shaft seal.

The heat exchanger 112 cools the atmosphere circulating in the transfer chamber. A water cooling jacket 113 is attached to other members required to be cooled and is configured to cool them.

The water-cooling system divides the introduced cooling water into five parts, and supplies them to needle valves 114a to 114e. The needle valves 114a to 114e are automatic valves and are configured such that the opening degree thereof can be continuously changed by electric control. Flow meters 115a to 115e as flow rate sensors are provided before or after the needle valves 114a to 114e, respectively. The needle valves 114a to 114e and the flow meters 115a to 115e are electrically connected to the process module controller 96.

The process module controller 96 periodically monitors the detected flow rates of the flow meters 115a to 115e, and checks whether the detected flow rates are deviated from a set value. If the detected flow rates are deviated from the set value, the corresponding needle valves 114a to 114e are controlled to make the flow rates equal to the set value. The process module controller 96 may lower each set value in conjunction with the execution status of the recipe or the temperature of the process furnace 12. For example, when the temperature of the process furnace 12 is equal to or lower than a predetermined value, the set value is changed so as to obtain a minimum flow rate. Thus, it is possible to minimize the consumption of the cooling water at the time of standby. Furthermore, it is also possible to set the set value directly from the operation part 52. For example, during maintenance, it is possible to completely close the needle valves 114a to 114e.

Next, a method of forming a thin film on the wafer 31 by a CVD method as one of processes of manufacturing a semiconductor device using the process furnace 12 according to the above configuration will be described. In the following description, the operation of each part constituting the substrate processing apparatus 1 is controlled by the main control part 95.

When a recipe for substrate processing is executed by the main control part 95, a plurality of wafers 31 are charged into the boat 38 (wafer charging). As shown in FIG. 9, the boat 38 holding the plurality of wafers 31 is lifted by the boat elevator 42 and loaded into the process chamber 68 (boat loading).

Next, the inside of the process chamber 68 is evacuated to a desired pressure (degree of vacuum) by the vacuum exhaust device 85. At this time, the pressure in the process chamber 68 is measured by the pressure sensor 83, and the pressure adjustment device 84 is feedback-controlled based on the measurement result. Furthermore, the inside of the process chamber 68 is heated by the heater 39 so as to reach a desired temperature. At this time, the state of supplying electric power to the heater 39 is feedback-controlled based on the temperature information detected by the temperature sensor 93 so that the inside of the process chamber 68 has a desired temperature distribution. Subsequently, the wafers 31 are rotated as the boat 38 is rotated by the rotation mechanism 88.

Next, the gas supplied from the chemical substance supply source and controlled by the MFC 77 to have a desired flow rate flows through the gas supply pipe 73 and is introduced into the process chamber 68 from the nozzle 72. The introduced gas rises inside the process chamber 68 and flows out from the upper end opening of the inner tube 66 into the cylindrical space 82. The gas is exhausted from the exhaust pipe 81. The gas comes into contact with the surfaces of the wafers 31 while passing through the inside of the process chamber 68. At this time, thin films are deposited on the surfaces of the wafers 31 by a thermal decomposition reaction.

When a predetermined processing time has elapsed, an inert gas is supplied from the inert gas supply source. The inside of the process chamber 68 is replaced with the inert gas, and the pressure in the process chamber 68 is returned to a normal pressure.

Thereafter, the seal cap 44 is lowered by the boat elevator 42, and the processed wafers 31 are unloaded from the lower end opening of the manifold 69 to the outside of the process tube 65 while being held by the boat 38 (boat unloading). Thereafter, the processed wafers 31 are taken out of the boat 38 (wafer discharging).

For example, processing conditions for processing the wafers 31 in the process furnace 12 of the present embodiments include a processing temperature of 600 to 700 degrees C., a processing pressure of 20 to 40 Pa, film-forming gas species of $SiH_2Cl_2$ and $NH_3$, film-forming gas supply amounts of 0 to 99.999 slm for $SiH_2Cl_2$ and 0 to 99.999 slm for $NH_3$, for example, in the case of forming a $Si_3N_4$ film. The wafers 31 are processed by consistently keeping each of the processing conditions at a certain value falling within each range.

In the above processing, the pressures (or flow rates) of the supplied gas (or air) detected by the pressure sensors 49, 62, and 101 provided in the heater chamber exhaust duct 50, the local exhaust duct 59, the scavenger exhaust duct 75, and the gas box exhaust duct 98, respectively, are constantly fed back to the process module controller 96.

The process module controller 96 compares a preset pressure target value with the detection result of each pressure sensor. If the detection result of each pressure sensor is different from the target value, the operation part 52 remotely controls each of the heater chamber exhaust damper valve 48, the transfer chamber exhaust damper valve 61, the scavenger exhaust damper valve 76, and the gas box exhaust damper valve 99 so that the detection result of each pressure sensor approaches the target value, and adjusts the opening degrees of the heater chamber exhaust damper valve 48, the transfer chamber exhaust damper valve 61, the scavenger exhaust damper valve 76, and the gas box exhaust damper valve 99. Further, the target value may be changed as the recipe progresses.

Furthermore, the main control part 95 determines the information of the chemical substance (processing gas) used in the gas box 79 and the use timing of the chemical substance based on the recipe or the like to be executed. When the chemical substance is not used, the gas box exhaust damper valve 99 is remotely controlled so that the opening degree thereof becomes small. Alternatively, when the chemical substance is not flowing in the gas box 79, the operation part 52 controls the gas box exhaust damper valve 99 so as to establish a specific pressure higher than the pressure available when the chemical substance is flowing. Moreover, when a plurality of types of chemical substances having different toxicities can be used, the pressure target value may be changed such that the lower the allowable exposure concentration of the substance being used, the lower the pressure of the gas box 79 (the stronger the suction).

The detection of the use timing of the chemical substance may be performed based on the opening/closing state of a customer equipment valve (not shown) provided upstream of the gas box 79 and the pressure in the gas supply pipe 73 through which the chemical substance flows, in addition to the executed recipe.

In addition, the feedback-control of the heater chamber exhaust damper valve 48, the transfer chamber exhaust damper valve 61, the scavenger exhaust damper valve 76, and the gas box exhaust damper valve 99 may not be constantly performed, but may be started when the pressure (or flow rate) detected by each pressure sensor deviates from a constant value by a predetermined amount or more, i.e., when the pressure (or flow rate) is out of a predetermined threshold value range set with respect to a target value. Alternatively, the feedback-control may be started when it is determined that there occurs a factor causing a change in pressure or flow rate, such as a change in the back pressure of the factory exhaust duct 9, a change in the flow rate of the clean air in the transfer chamber 35, a change in the cooling state of the heater 39, the opening or the like of the door of the gas box 79, and the like. Furthermore, the feedback-control may be ended when the detection result of each pressure sensor falls within a range of a predetermined threshold value or after a predetermined time has elapsed. By not constantly performing the feedback-control, it is possible to prolong the life of each exhaust damper valve.

The process module controller 96 monitors the measurement result of a gas concentration meter 102. Upon detecting a gas having a concentration higher than a specified value, the process module controller 96 notifies the gas detection to the main control part 95, thereby performing control to close the valve 78, interrupt the recipe, and open an emergency dilution valve 103 for a predetermined time.

As described above, in the present embodiments, the opening degrees of the heater chamber exhaust damper valve 48, the transfer chamber exhaust damper valve 61, the scavenger exhaust damper valve 76, and the gas box exhaust damper valve 99 can be remotely controlled via the operation part 52 provided at a height operable by a worker from the installation surface of the substrate processing apparatus 1, and the suction amount and suction force of the atmosphere can be adjusted. Therefore, even when each exhaust damper valve is provided at a high place, the worker does not need to go to the high place to adjust the opening degree of each exhaust damper valve, which makes it possible to enhance the safety of the worker.

Furthermore, in the present embodiments, the operation part 52 remotely controls the opening degree of each exhaust damper so that the pressure (or flow rate) in each exhaust duct is kept constant. Therefore, even if the back pressure of each duct (the pressure of the factory exhaust duct) is changed due to the change in the operation status of another substrate processing apparatus or the exhaust status of each duct of the apparatus, it is not necessary to periodically and manually adjust the opening degree of each exhaust damper valve in order to keep constant the pressure in each exhaust duct, which makes it possible to enhance the workability.

In addition, by keeping constant the pressure in each exhaust duct, it is possible to prevent the activation of a safety circuit for stopping the supply of a chemical substance due to a pressure drop. Therefore, it is possible to prevent production failure due to the stoppage of supply of a chemical substance to the wafers 31 under processing and to improve the productivity of the wafers 31.

Since the pressure inside each exhaust duct is kept constant, it is not necessary to increase the opening degree of each exhaust damper valve with a margin in order to prevent pressure drop. Therefore, it is possible to reduce excessive utility and to achieve energy saving and production cost reduction.

In the present embodiments, the heater chamber exhaust duct 50, the local exhaust duct 59, the scavenger exhaust duct 75, and the gas box exhaust duct 98 are all connected to the factory exhaust duct 9. However, only a part of the respective exhaust ducts may be connected to the factory exhaust duct 9. For example, the heater chamber exhaust duct 50 and the local exhaust duct 59 may be merged and connected to the factory exhaust duct 9, and the scavenger exhaust duct 75 and the gas box exhaust duct 98 may be allowed to individually and independently extend to the outside of a factory. In this case, the transfer chamber exhaust damper valve 61 may be omitted by allowing the heater chamber exhaust damper valve 48 to perform the function of the transfer chamber exhaust damper valve 61.

The combination of the exhaust ducts connected to the factory exhaust duct 9 is not limited to the above-described one. It goes without saying that the exhaust ducts may be connected to the factory exhaust duct 9 in various combinations.

According to the present disclosure in some embodiments, the opening degree of the exhaust damper valve provided at a high place is automatically adjusted, which makes it unnecessary to periodically and manually adjust the opening degree of the exhaust damper valve. Therefore, excellent effects are obtained in that the safety of workers can be ensured and the workability can be improved.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a process container;
a lid configured to close an opening of the process container;
a transfer chamber configured to communicate with the opening of the process container when the lid is opened, and transfer a substrate;
a heater configured to heat the substrate in the process container;
a gas box configured to accommodate a device that controls a flow of a gas supplied to the process container;
a scavenger installed to surround a periphery of an introducing portion whereby the gas is introduced into the process container;
a heater chamber exhaust duct configured to discharge an air that has cooled a space at which the heater is installed;
a gas box exhaust duct configured to suck and discharge an atmosphere in the gas box;
a scavenger exhaust duct configured to suck and discharge an atmosphere in the scavenger;
a local exhaust duct configured to communicate with a local exhaust port installed at a predetermined location in the transfer chamber, and suck and discharge an atmosphere in the local exhaust port;
an exhaust damper valve including an opening degree variable mechanism installed in at least one selected from the group of the heater chamber exhaust duct, the gas box exhaust duct, the scavenger exhaust duct, and the local exhaust duct, which are connected to a factory exhaust duct kept at a negative pressure; and
a controller installed at a height operable from an installation surface, and configured to remotely control an opening degree of the exhaust damper valve in response to an operation.

2. The apparatus of claim 1, further comprising:
a sensor configured to detect a pressure of an upstream side of the exhaust damper valve or a flow rate in the exhaust damper valve,
wherein the controller is configured to feedback-control the exhaust damper valve to keep the pressure or the flow rate detected by the sensor at a constant value.

3. The apparatus of claim 1, wherein the controller includes an operation part including:
an input part configured to input a control value of the opening degree of the exhaust damper valve; and
a display part configured to display the inputted control value to be recognizable, and
wherein the controller is configured to control the opening degree of the exhaust damper valve based on the inputted control value.

4. The apparatus of claim 2, wherein the exhaust damper valve is installed at the scavenger exhaust duct, and
wherein the controller is configured to perform a control so as to:
detect information of a chemical substance used in the gas box and a use timing of the chemical substance; and
when the chemical substance is not flowing, automatically remotely operate the exhaust damper valve to fully close the exhaust damper valve or set an inside of the scavenger to a specific pressure higher than a pressure of the inside of the scavenger when the chemical substance is flowing.

5. The apparatus of claim 2, further comprising:
a gas box exhaust damper valve including an opening degree variable mechanism installed at the gas box exhaust duct,
wherein the controller is configured to perform a control so as to:

detect information of a chemical substance used in the gas box and a use timing of the chemical substance; and when the chemical substance is not flowing, automatically remotely operate the gas box exhaust damper valve to fully close the gas box exhaust damper valve or set an inside of the gas box to a specific pressure higher than a pressure of the inside of the gas box when the chemical substance is flowing.

6. The apparatus of claim 2, wherein two or more of the heater chamber exhaust duct, the gas box exhaust duct, the scavenger exhaust duct, and the local exhaust duct merge and are connected to the factory exhaust duct via one to three exhaust damper valve.

7. The apparatus of claim 2, wherein the feedback-control is started when the pressure or the flow rate detected by the sensor deviates from the constant value by a predetermined value or more or when it is determined that there occurs a change in a flow rate of a clean air in the transfer chamber that causes a change in a pressure or a flow rate, a change in a cooling state of the heater, or an opening of a door of the gas box, and wherein the feedback-control is ended when the feedback-control is converged or after a predetermined time has elapsed from a start of the feedback-control.

8. The apparatus of claim 2, wherein the controller is configured to perform a control so as to:

detect information of a chemical substance used in the gas box and a use timing of the chemical substance; and when the chemical substance is not flowing, automatically remotely operate the exhaust damper valve to fully close the exhaust damper valve or set an inside of the gas box to a specific pressure higher than a pressure of the inside of the gas box when the chemical substance is flowing.

9. The apparatus of claim 8, wherein the controller is configured to determine a presence or an absence of the chemical substance flowing through the gas box, based on an opening/closing state of a valve installed upstream of the gas box, a pressure in a supply pipe of the chemical substance, and an execution state of a recipe.

10. The apparatus of claim 2, further comprising:

a gas concentration meter installed at or downstream of the scavenger exhaust duct, and configured to monitor a concentration of a specific gas type; and an emergency dilution valve configured to be opened when the gas concentration meter detects a gas having a concentration higher than a specified value, and discharge a diluting nitrogen gas to or downstream of the scavenger exhaust duct.

* * * * *